US011335590B2

(12) United States Patent
Gilchrist et al.

(10) Patent No.: US 11,335,590 B2
(45) Date of Patent: *May 17, 2022

(54) METHODS FOR FORMING ELONGATED CONTACT HOLE ENDS

(71) Applicant: Applied Materials, Inc., Santa Clara, CA (US)

(72) Inventors: Glen F. R. Gilchrist, Danvers, MA (US); Shurong Liang, Lynnfield, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/032,767

(22) Filed: Sep. 25, 2020

(65) Prior Publication Data

US 2021/0020499 A1   Jan. 21, 2021

Related U.S. Application Data

(63) Continuation of application No. 16/579,232, filed on Sep. 23, 2019, now Pat. No. 10,840,132.

(60) Provisional application No. 62/872,018, filed on Jul. 9, 2019.

(51) Int. Cl.
*H01L 21/768* (2006.01)
*H01L 21/311* (2006.01)
*H01L 21/265* (2006.01)
*H01L 21/687* (2006.01)

(52) U.S. Cl.
CPC .. *H01L 21/76816* (2013.01); *H01L 21/26586* (2013.01); *H01L 21/311* (2013.01); *H01L 21/31116* (2013.01); *H01L 21/68764* (2013.01)

(58) Field of Classification Search
None
See application file for complete search history.

(56) References Cited

U.S. PATENT DOCUMENTS

2016/0379816 A1* 12/2016 Ruffell ............... H01L 21/0273
438/712

FOREIGN PATENT DOCUMENTS

CN   105556680 A     5/2016
CN   105556680    * 12/2017  ......... H01L 31/0352

* cited by examiner

*Primary Examiner* — Jiong-Ping Lu
(74) *Attorney, Agent, or Firm* — KDB

(57) ABSTRACT

Disclosed is a semiconductor processing approach wherein a wafer twist is employed to increase etch rate, at select locations, along a hole or space end arc. By doing so, a finished hole may more closely resemble the shape of the incoming hole end. In some embodiments, a method may include providing an elongated contact hole formed in a semiconductor device, and etching the elongated contact hole while rotating the semiconductor device, wherein the etching is performed by an ion beam delivered at a non-zero angle relative to a plane defined by the semiconductor device. The elongated contact hole may be defined by a set of sidewalls opposite one another, and a first end and a second end connected to the set of sidewalls, wherein etching the elongated contact hole causes the elongated contact hole to change from an oval shape to a rectangular shape.

20 Claims, 8 Drawing Sheets

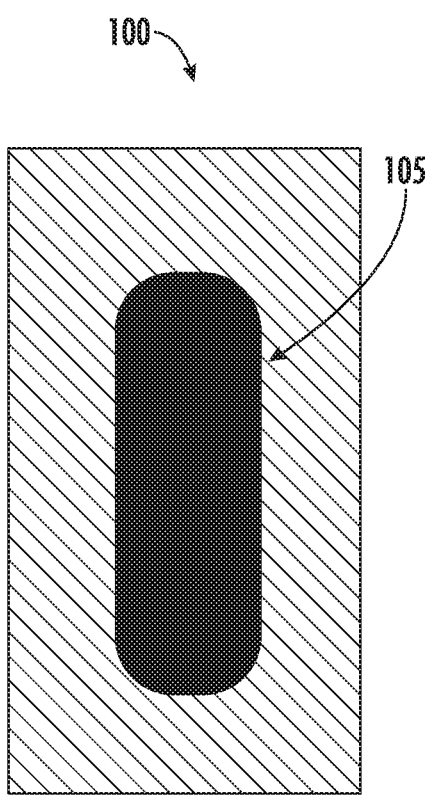
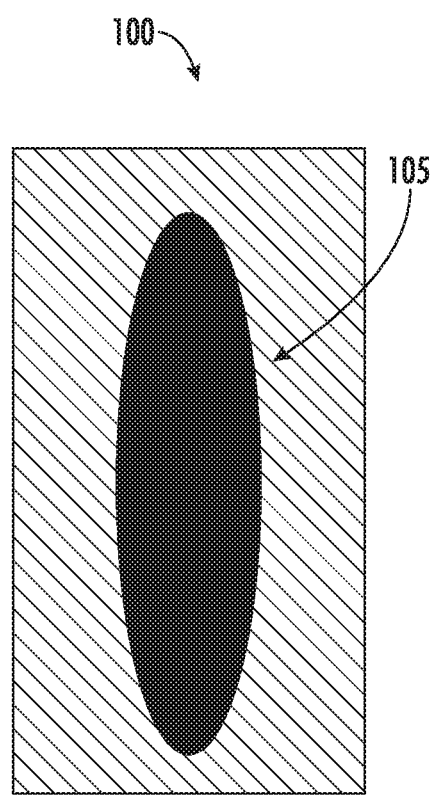
FIG. 1A
(PRIOR ART)
FIG. 1B
(PRIOR ART)

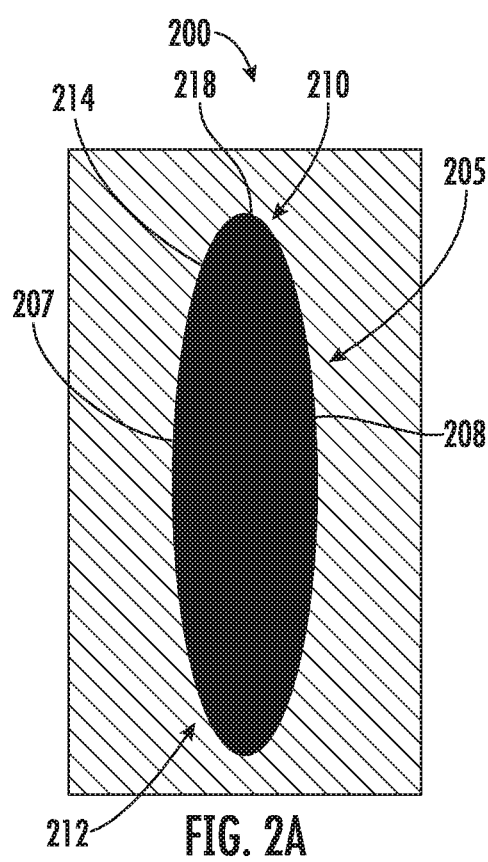 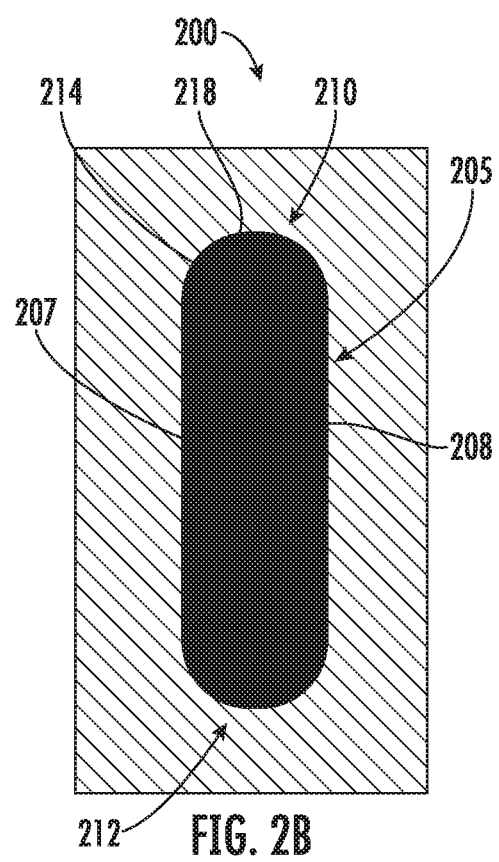

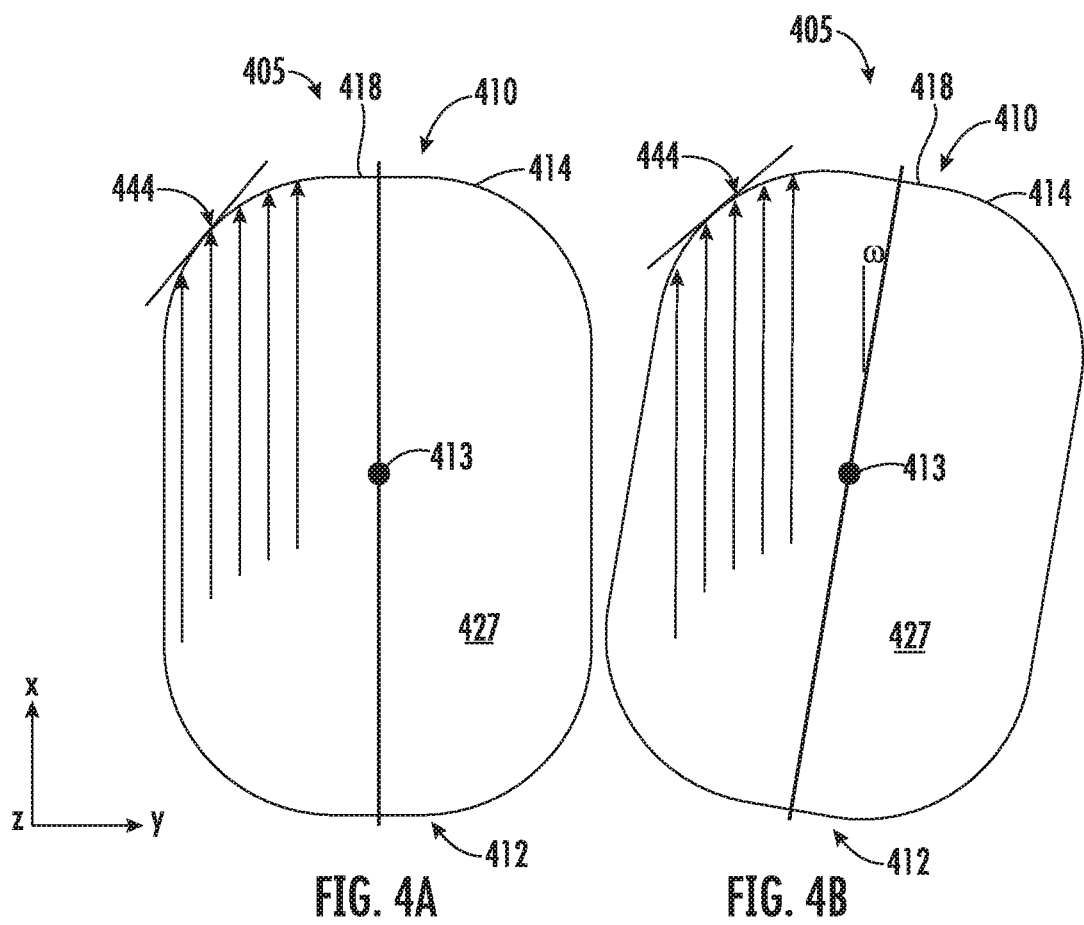

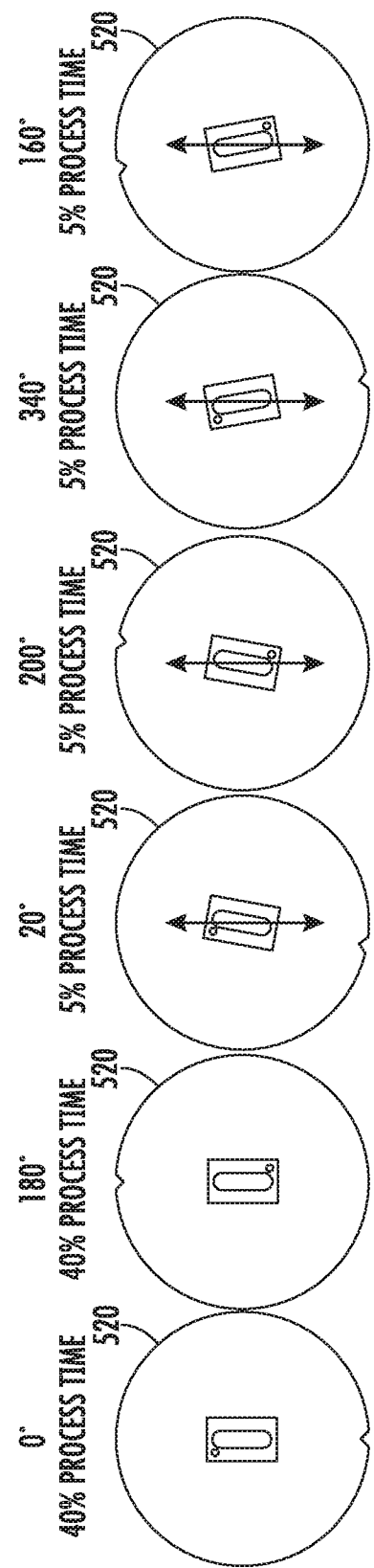

METHODS FOR FORMING ELONGATED CONTACT HOLE ENDS

RELATED APPLICATIONS

This application claims priority to and is a continuation application of U.S. Non-Provisional patent application Ser. No. 16/579,232, filed on Sep. 23, 2019, entitled "METHODS FOR FORMING ELONGATED CONTACT HOLE ENDS," which claims priority to U.S. provisional patent application 62/872,018, filed Jul. 9, 2019, entitled "Method for Forming Elongated Contact Hole Ends," which are incorporated herein by reference in their entirety.

FIELD OF THE DISCLOSURE

Embodiments of the present disclosure relate to formation of semiconductor structures. More particularly, embodiments of the present disclosure relate to methods for forming elongated contact hole ends within semiconductor structures.

BACKGROUND OF THE DISCLOSURE

Fabrication of advanced three-dimensional (3-D) semiconductor structures with complex surface topology and high packing density is populated with complex technical challenges. Some of these challenges are addressed for metal and dielectrics using directed reactive ion etching (DRIE).

During conventional one-dimensional (1D) patterning, such as contact hole elongation, via hole alignment, or space tip to tip push, the shape of the hole or space end may be changed from a square or semi-circular arc to a sharper parabolic-like arc, as demonstrated in FIGS. 1 and 2. This change may result in a decrease in hole or space width at either end, which may result in a loss of contact efficacy. Maintenance of the shape at the end of the hole or space would therefore be desirable.

SUMMARY OF THE DISCLOSURE

In one approach, a method may include providing an elongated contact hole formed in a semiconductor device, and etching the elongated contact hole while rotating the semiconductor device, wherein the etching is performed by an ion beam delivered at a non-zero angle relative to plane defined by the semiconductor device. The elongated contact hole may be defined by a set of sidewalls opposite one another, and a first end and a second end connected to the set of sidewalls, wherein etching the elongated contact hole causes the elongated contact hole to change from an oval shape to a rectangular shape.

In another approach, a method of forming a contact hole in a semiconductor device may include providing the contact hole extending through the semiconductor device. The contact hole may include a set of sidewalls opposite one another, and a first end and a second end connected to the set of sidewalls, wherein the contact hole has an oval shape. The method may further include etching the contact hole while rotating the semiconductor device about an axis of rotation extending perpendicular to a plane defined by a top surface of the semiconductor device, wherein the etching causes at least one end of the contact hole to change from the oval shape to a rectangular shape.

In yet another approach, a method of forming an elongated contact hole in a semiconductor device may include providing the elongated contact hole extending through the semiconductor device, wherein the elongated contact hole includes a set of sidewalls opposite one another, a first end and a second end connected to the set of sidewalls, wherein the elongated contact hole has an oval shape. The elongated contact hole may further include a set of shoulder areas between the set of sidewalls and an apex of the first end or the second end. The method may further include etching the elongated contact hole while rotating the semiconductor device about an axis of rotation extending perpendicular to a plane defined by a top surface of the semiconductor device, wherein the etching is performed by an ion beam delivered at a non-zero angle relative to the plane, and wherein the etching causes a material of the semiconductor device at the set of shoulder areas to be etched faster than the material of the semiconductor device at the apex.

BRIEF DESCRIPTION OF THE DRAWINGS

The accompanying drawings illustrate exemplary approaches of the disclosed embodiments so far devised for the practical application of the principles thereof, and wherein:

FIG. 1A depicts a prior art incoming hole pattern in a semiconductor device;

FIG. 1B depicts a prior art incoming hole pattern in the semiconductor device following various etch steps;

FIGS. 2A-2B depict a hole pattern in a semiconductor device following various etch steps in accordance with embodiments of the present disclosure;

FIGS. 4A-4B demonstrate a change in angle of incidence and etch rate with change in wafer/platen twist in accordance with embodiments of the present disclosure;

FIGS. 5A-5F demonstrate relative process times and wafer/platen twist angles in accordance with embodiments of the present disclosure;

Figure 3:
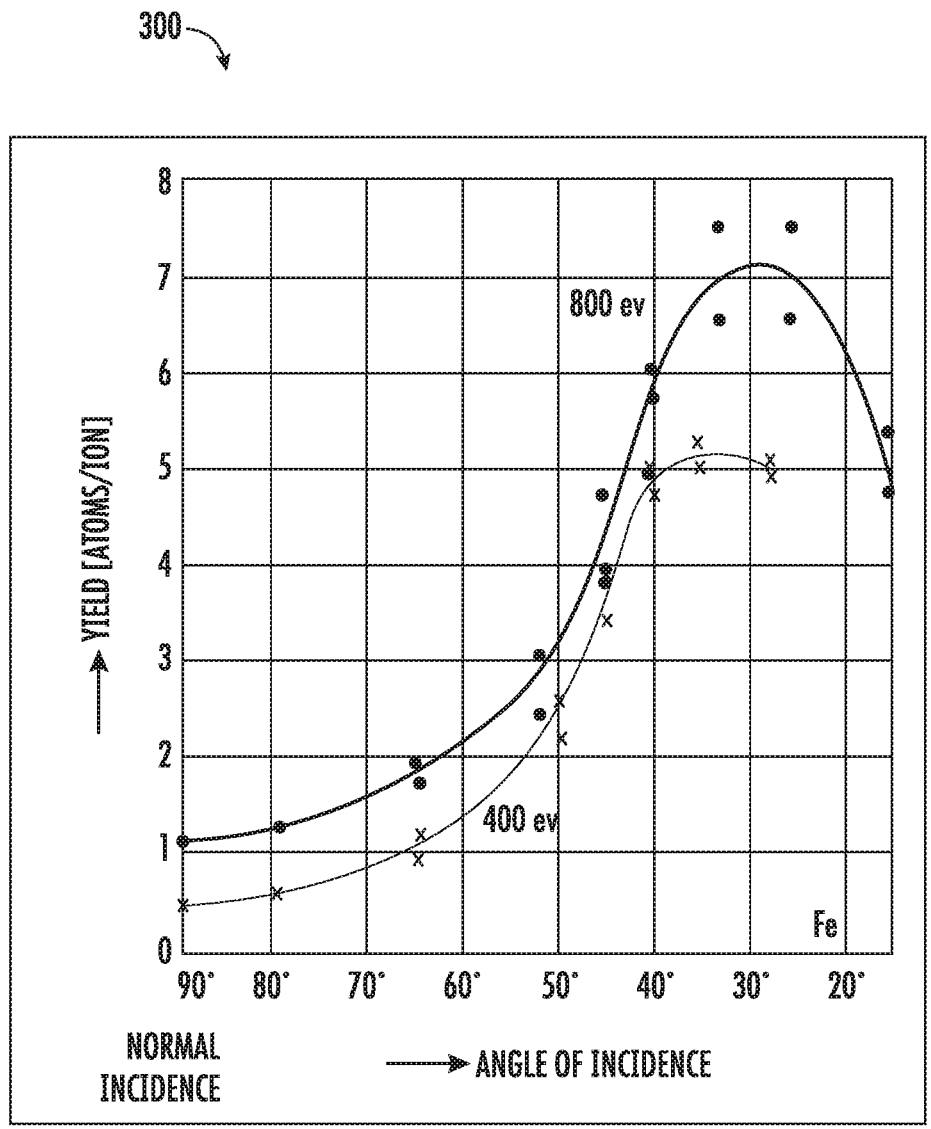
FIG. 3 is a graph demonstrating sputter yield versus ion beam angle of incidence in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

Embodiments herein improve on conventional 1-D patterning hole elongation, such as the hole 105 shown in the devices 100 of FIGS. 1A-1B, by enabling the shape of the ends of the hole 105 to be formed into a desired shape. For example, by making the ends or apex of the hole 105 less pointed and more squared, contact area may be increased. Through the approaches described herein, custom hole end arcs and shapes may be achieved.

FIGS. 2A-2B demonstrate a hole 205 or opening in a device 200, such as a wafer, according to embodiments of the present disclosure. As will be appreciated, the hole 205 may be an elongated contact hole defined generally by a set of sidewalls 207, 208 opposite one another. In some embodiments, the sidewalls 207, 208 include one or more flattened sections parallel to one another. In other embodiments, the sidewalls 207, 208 are curvilinear shaped. It will be appreciated that the sidewalls 207, 208 may change from the curvilinear shape demonstrated in FIG. 2A to the parallel configuration demonstrated in FIG. 2B in response to an etch to a set of shoulder areas 214 of the hole 205.

As shown, the hole 205 may include a first end 210 opposite a second end 212. In some embodiments, the first and second ends 210, 212 are generally symmetrical. In other embodiments, the first and second ends 210, 212 may not be symmetrical. Each of the first and second ends 210, 212 may be defined by the set of shoulder areas 214 joined at the apex 218. As shown, the set of shoulder areas 214 connect respective sidewalls 207, 208 to each apex 218.

It may be desirable to have a generally flatter apex 218 and square, wide shoulder areas 214. To accomplish this, the device 200 may be rotated or twisted to increase an etch rate, at selected locations, along the first and second ends 210, 212. Wafer twist refers to rotation about a rotation axis extending perpendicular a plane defined by a top surface of the wafer 200 when the wafer 200 is clamped to the chuck and ready to be processed. Twisting the wafer 200 with respect to the angled ion beam changes the angle of incidence and the ion flux at every point along the curvilinear shaped sidewalls at the first and second ends 210, 212 of the contact hole 205. As will be described in greater detail below, sidewall etch rate is a function of several factors including angle of incidence and ion flux. In exemplary embodiments, the etch rate and therefore the shape of the first and second ends 210, 212 is controlled by wafer twist.

In some embodiments, different device twist positions are used during a single wafer 1D patterning etch to "square off" the shoulder areas 214 and/or the apex 218 so that the first and second ends 210, 212 more closely resembles the shape of the incoming or starting hole end, which is depicted in FIG. 1A. For example, the etch rate at the shoulder areas 214 may be greater than an etch rate at the apex 218. FIG. 2B demonstrates the contact hole 205 with squared first and second ends 210, 212.

Etch rate is a function of several factors including the angle of incidence between the incoming ions and the surface being etched. For pattern wafer vertical surfaces of 3D structures, the angle of incidence, $\Phi$, is the compound angle resulting from the ion beam angle, $\theta$, emitted from the ion source and the angle of the surface relative to the scan axis, $\omega$, such that:

$$\Phi = \arcsin(\sin\theta \sin\omega)$$

On some platforms, $\theta$ can be controlled with ion energy, RF power and z gap, while $\omega$ can be controlled with wafer/platen twist. FIG. 3 is a graph 300 showing the relation between ion angle of incidence and sputter yield, which correlates with RIE etch rate. Sputtering of atoms from a substrate is the result of the physical collision between energetic ions, typically >100 eV, and atoms in the substrate lattice, which are dislocated and ejected as a result of the collisions. RIE also depends on ion collisions, causing lattice dislocations, to provide reactive sites for the chemical reactions that drive reactive ion etching. Therefore, the RIE etch rate depends on angle of incidence $\Phi$ in a manner similar to sputtering shown in FIG. 3.

Figure 4C:
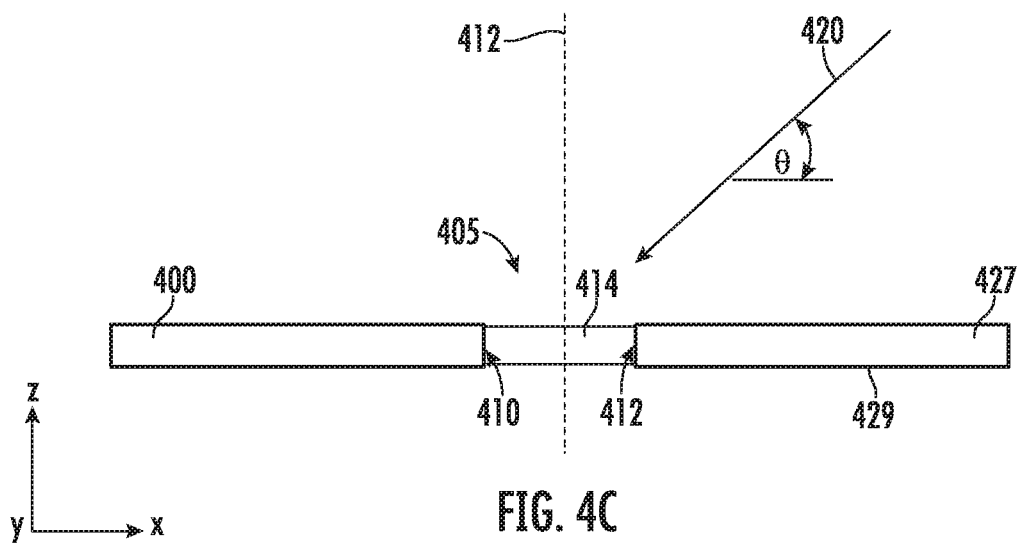
FIG. 4C is a side cross-sectional view of an angled ion implant to the semiconductor device in accordance with embodiments of the present disclosure.

FIGS. 4A-4B show schematic top views, and FIG. 4C a side cross-sectional view, of an elongated contact hole 405, including how angle of incidence $\Phi$ and etch rate change with wafer/platen twist, proportional to w, for constant ion beam angle, $\theta$. For example, FIG. 4A may represent the wafer 400 at a first twist location, while FIG. 4B may represent the wafer 400 at a second twist location after rotating ($\omega$) about an axis of rotation 413. As shown, the angled ion beam 420 etches the material of the wafer 400 at a non-zero angle relative to plane defined by a top surface 427 of the wafer 400. The term "at a non-zero angle" unless otherwise noted, may also denote a single angle or a range of angles at least some of some of the angles being non-perpendicular to the plane of the top surface 427 being impacted. Thus, when ions are provided to the wafer 400 "at an angle" the ions may be provided over a range of angles including positive and negative angles with respect to the axis of rotation 413, and are effective to strike or impact the sidewall(s) 414 defining the elongated contact hole 405, including at the first end 410 and/or the second end 412.

Twisting the wafer 400 with respect to the angled ion beam 420 changes the angle of incidence $\Phi$ and ion flux at every point along the sidewall 414, which in turn changes etch rate of the sidewall 414. In exemplary embodiments, the etch rate, and therefore the shape of the first and second ends 410 and 412, is controlled by rotation about the axis of rotation 413, which may be optimized to cause the shoulder areas 444 of the first and/or second ends 410, 412 to be etched faster than the apex 418.

More specifically, during operation, processing may include directing the angled ion beam 420 into the sidewall 414 as part of an etch process. In other embodiments, the angled ion beam 420 may be directed at the sidewall 414 to form a treated layer there along. Processing may be performed while the wafer 400 is in a first rotational position, for example as shown in FIG. 4A. The angled ion beam 420 may impact a portion of the sidewall 414 between the top surface 427 and a bottom surface 429 of the wafer 400. In some embodiments, the ion beam 420 does not impact the entire height or thickness (e.g., along the z-direction) of the sidewall 414.

The wafer 400 may then be rotated to a second rotational position while the ion beam 420 is processing the sidewall 414. Alternatively, the ion beam 420 may stop prior to rotation of the wafer 400, and resume when the wafer 400 is brought to the second rotational position. As shown, the wafer 400 may rotate about the axis of rotation 413 by a rotation angle, $\omega$. Although non-limiting, w may be between 5-45°.

In the second rotational position shown in FIG. 4B, the ion beam 420 may impact a larger portion of the sidewall 414. As the wafer 400 continues to rotate about the axis of rotation 413, the height of the ion beam 420 increases until the ion beam 420 impacts approximately the entire height of the sidewall 414, e.g., between top and bottom surfaces 427, 429. In some embodiments, rotation of the wafer 400 and processing by the ion beam 420 stops to prevent the ion beam 420 from significantly impacting the top surface 427 of the wafer 400. In other embodiments, rotation continues, and thus the ion beam 420 continues onto the top surface 427 for implanting or etching.

In some embodiments, as the substrate 400 is rotated between the first and second rotational positions shown in FIGS. 4A-4B, respectively, the non-zero angle θ of the ion beam 420 with respect to the axis of rotation 413 remains fixed. More specifically, the ion beam 420 has the same beam angle relative to the ion source while the wafer 400 rotates between two different orientations. Furthermore, a voltage used to generate and/or deliver the ion beam 420 may remain constant between the first and second rotational positions in some embodiments. In other words, the angled ion beam 420 and rotation of the wafer 400 provides a uniform ion flux from top to bottom surfaces 427, 429 across the entire vertical height of the sidewall 414 without changing any ion source settings and regardless of the device aspect ratio. This approach achieves continuous beam angle control. In other embodiments, the voltage may vary between the first and second rotational positions.

Figure 6A:
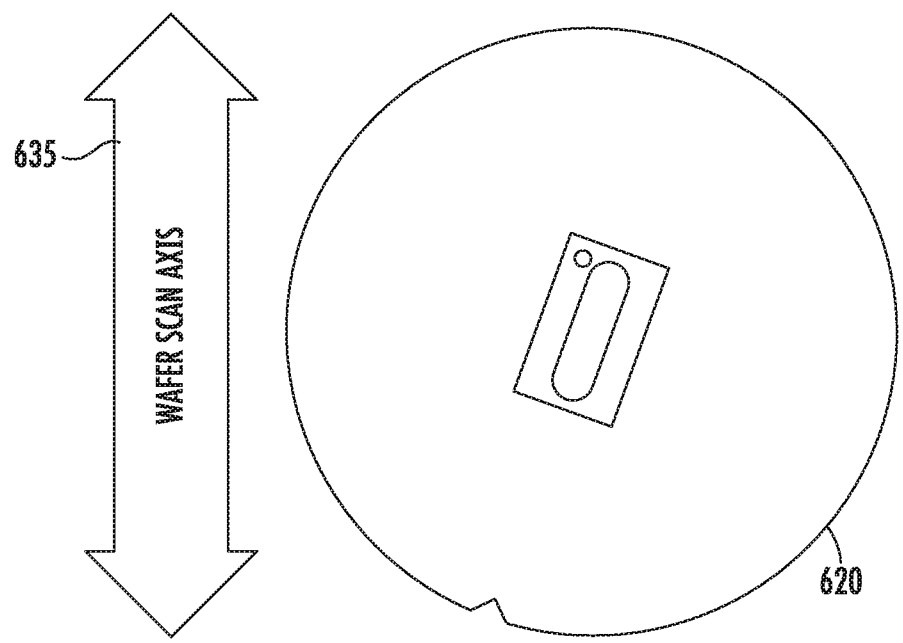
FIGS. 6A-6B demonstrate an asymmetric etch achieved at a single wafer/platen twist angle of 20° in accordance with embodiments of the present disclosure.
Figure 6B:
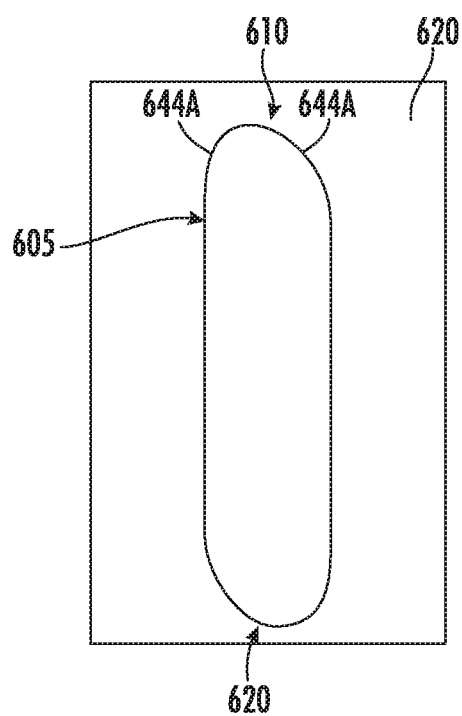

FIGS. 5A-5E show the relative process times and wafer/platen 520 twist angles used to achieve the result in FIG. 2B, while FIGS. 6A-6B show the asymmetric etch result of various elongated contact holes 605 along a wafer scan axis 635 using a single wafer/platen 620 twist angle of 20°. In this example, shoulder regions 644A and 644B are asymmetrical relative to one another at a first end 610 of the elongated contact hole 605 due to different etch rates. As shown, shoulder region 644A has a greater etch rate than shoulder region 644B. The second end 612 of the elongated contact hole 605 may also be asymmetrically etched. In other embodiments, the first end 610 may be asymmetrically etched, while the second end 612 may be symmetrically etched. Embodiments herein are not limited in this context.

Figure 7:
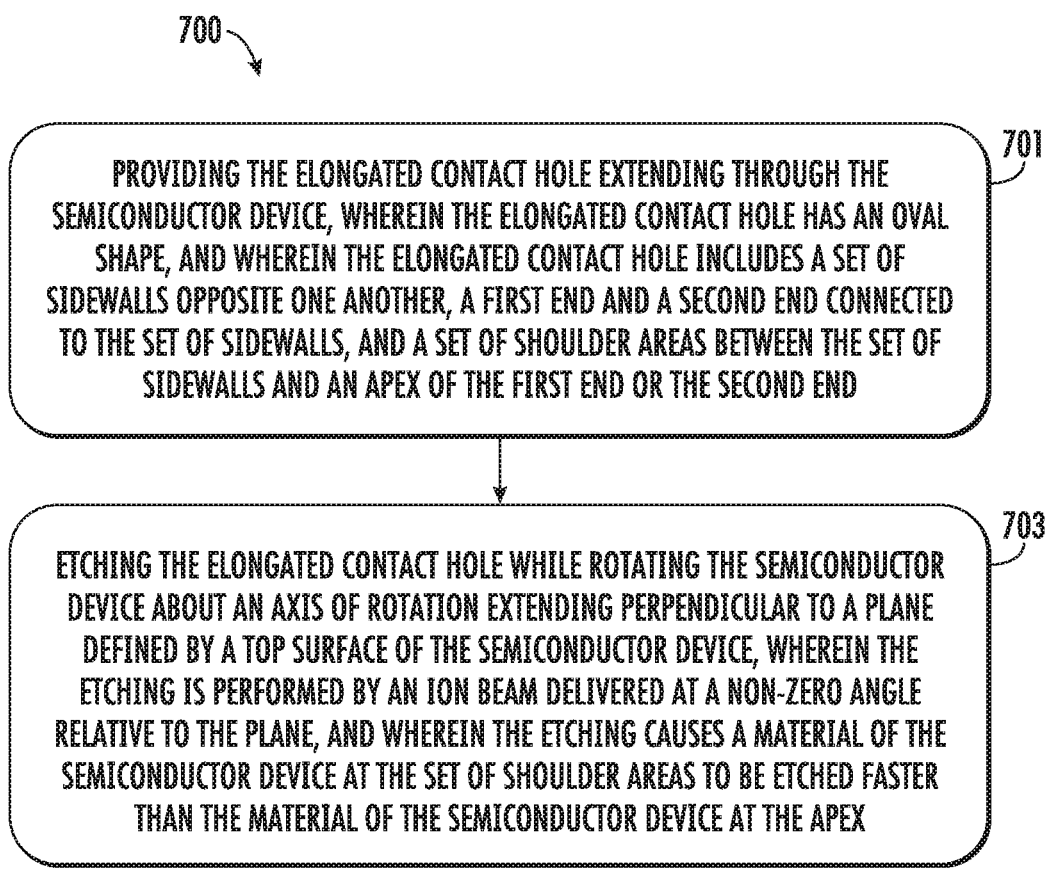
FIG. 7 is a process flow for forming elongated contact holes in a semiconductor device in accordance with embodiments of the present disclosure.

Turning now to FIG. 7, a method 700 of forming a contact hole in a semiconductor device will be described. At block 701, the method 700 may include providing the elongated contact hole extending through the semiconductor device, wherein the elongated contact hole has an oval shape, and wherein the elongated contact hole includes a set of sidewalls opposite one another, a first end and a second end connected to the set of sidewalls, a set of shoulder areas between the set of sidewalls and an apex of the first end or the second end.

At block 703, the method 700 may include etching the elongated contact hole while rotating the semiconductor device about an axis of rotation extending perpendicular to a plane defined by a top surface of the semiconductor device, wherein the etching is performed by an ion beam delivered at a non-zero angle relative to the plane, and wherein the etching causes a material of the semiconductor device at the set of shoulder areas to be etched faster than the material of the semiconductor device at the apex.

In some embodiments, etching the set of shoulder areas causes the set of sidewalls to extend parallel to one another. In some embodiments, an angle of incidence and an ion flux are optimized at the first and second ends of the contact hole to cause the set of shoulder areas to be etched faster than the apex. In some embodiments, the angle of incidence is determined based on the non-zero angle of the ion beam and an angle of rotation of the semiconductor device about the axis of rotation. In some embodiments, the angle of incidence varies as the semiconductor device is rotated, while the non-zero angle of the ion beam remains constant.

In sum, embodiments herein provide a novel application over the prior art 1-D patterning hole elongation in which etch time is divided between elongating the hole or pushing the tip to tip bridge and forming or shaping the end of the hole or space. In a first advantage, embodiments of the present disclosure provide asymmetric hole end arc formation to customize the shape of a hole, space, or line beyond that which may be achieved with EUV lithography and for a fraction of the time and cost. In a second advantage, embodiments of the present disclosure increase hole or space width at one or both ends of the elongated contact hole, thus resulting in an increase in contact efficacy.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing an elongated contact hole formed in a semiconductor device; and
etching the elongated contact hole to cause the elongated contact hole to change from an oval shape to a rectangular shape.

2. The method of claim 1, further comprising rotating the semiconductor device while the elongated contact hole is being etched, wherein the etching is performed by an ion beam delivered at a non-zero angle relative to a plane defined by the semiconductor device.

3. The method of claim 2, further comprising etching a set of shoulder areas between a set of sidewalls, wherein etching the set of shoulder areas causes the set of sidewalls to extend parallel to one another.

4. The method of claim 3, wherein an angle of incidence and an ion flux are optimized at a first end and a second end of the elongated contact hole to cause the set of shoulder areas to be etched faster than an apex of the elongated contact hole.

5. The method of claim 4, wherein the angle of incidence is determined based on the non-zero angle of the ion beam and an angle of rotation of the semiconductor device about an axis of rotation, wherein the axis of rotation extends perpendicular to the plane defined by the semiconductor device.

6. The method of claim 4, wherein the angle of incidence varies as the semiconductor device is rotated.

7. The method of claim 2, further wherein the non-zero angle of the ion beam is constant as the semiconductor device is rotated.

8. A method of forming a contact hole in a semiconductor device, comprising:
providing the contact hole extending through the semiconductor device, wherein the contact hole comprises:
a set of sidewalls opposite one another; and
a first end and a second end connected to the set of sidewalls, wherein the contact hole has an oval shape; and
etching the contact hole to cause the contact hole to change from the oval shape to a rectangular shape.

9. The method of claim 8, wherein the etching comprises delivering an ion beam to the contact hole at a non-zero angle relative to a plane defined by a top surface of the semiconductor device.

10. The method of claim 9, further comprising rotating, while the contact hole is being etched, the semiconductor about an axis of rotation extending perpendicular to the plane.

11. The method of claim 10, further comprising etching a set of shoulder areas between the set of sidewalls and an apex of the first end and the second end, wherein etching the set of shoulder areas causes the set of sidewalls to extend parallel to one another.

12. The method of claim 11, wherein an angle of incidence and an ion flux are optimized at the first end and the second end of the contact hole to cause the set of shoulder areas to be etched faster than the apex.

13. The method of claim 12, wherein the angle of incidence is determined based on the non-zero angle of the ion beam and an angle of rotation of the semiconductor device about the axis of rotation.

14. The method of claim 12, wherein the angle of incidence varies as the semiconductor device is rotated.

15. The method of claim 10, wherein the non-zero angle of the ion beam is constant as the semiconductor device is rotated.

16. The method of claim 9, wherein the etching is performed at just the first end or the second end of the contact hole.

17. A method of forming an elongated contact hole in a semiconductor device, comprising:
providing the elongated contact hole through the semiconductor device, wherein the elongated contact hole has an oval shape, and wherein the elongated contact hole comprises:
a set of sidewalls opposite one another;
a first end and a second end connected to the set of sidewalls; and
a set of shoulder areas between the set of sidewalls and an apex of the first end or the second end; and
etching the elongated contact hole while rotating the semiconductor device about an axis of rotation extending perpendicular to a plane defined by a top surface of the semiconductor device, wherein the etching causes the elongated contact hole to change from the oval shape to a rectangular shape.

18. The method of claim 17, wherein the etching is performed by an ion beam delivered at a non-zero angle relative to the plane, and wherein the etching causes a material of the semiconductor device at the set of shoulder areas to be etched faster than the material of the semiconductor device at the apex.

19. The method of claim 18, wherein etching the set of shoulder areas causes the set of sidewalls to extend parallel to one another.

20. The method of claim 17, wherein an angle of incidence and an ion flux are optimized at the first end and the second end of the contact hole to cause the set of shoulder areas to be etched faster than the apex, and wherein the angle of incidence is determined based on the non-zero angle of the ion beam and an angle of rotation of the semiconductor device about the axis of rotation.

* * * * *